United States Patent
Kenyon et al.

(10) Patent No.: US 10,944,543 B2
(45) Date of Patent: Mar. 9, 2021

(54) SIGNAL CONDITIONING IN A SERIAL DATA LINK

(71) Applicant: TEXAS INSTRUMENTS INCORPORATED, Dallas, TX (US)

(72) Inventors: Eleazar Walter Kenyon, Tucker, GA (US); Arlo James Aude, Lawrenceville, GA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/916,968

(22) Filed: Jun. 30, 2020

(65) Prior Publication Data

US 2020/0336288 A1 Oct. 22, 2020

Related U.S. Application Data

(62) Division of application No. 16/359,026, filed on Mar. 20, 2019, now Pat. No. 10,742,391.

(51) Int. Cl.
*H04L 7/033* (2006.01)

(52) U.S. Cl.
CPC .................. *H04L 7/0331* (2013.01)

(58) Field of Classification Search
CPC .................................................. H04L 7/0331
See application file for complete search history.

(56) References Cited

U.S. PATENT DOCUMENTS

| 7,295,053 | B2* | 11/2007 | Lesso | H03L 7/0812 327/155 |
| 2002/0163392 | A1* | 11/2002 | Horan | H03L 7/0812 331/57 |
| 2008/0116950 | A1* | 5/2008 | Baek | H03L 7/0816 327/158 |
| 2015/0213873 | A1* | 7/2015 | Joo | H03L 7/083 365/154 |
| 2019/0007189 | A1* | 1/2019 | Hossain | H04L 7/0016 |

* cited by examiner

*Primary Examiner* — Freshteh N Aghdam
(74) *Attorney, Agent, or Firm* — John R. Pessetto; Charles A. Brill; Frank D. Cimino

(57) ABSTRACT

A signal conditioner for use in a serial data communications link. The signal conditioner including a tunable delay element responsive to a tuning signal to provide time domain delay modulation of the input data signals to generate conditioned (output) data signals, and phase comparator circuitry to generate the delay tuning signal based on a detected phase error between feedback conditioned data signals, and a reference signal. The tunable delay element and the phase comparator circuitry forming a delay-locked tuning loop to phase lock the conditioned data signals to the reference signal, independent of voltage domain frequency response. An example signal conditioner is a jitter attenuator/cleaner, where the bandwidth of the reference signal is lower than the bandwidth of the delay-locked tuning loop, to provide a low-jitter reference signal.

4 Claims, 3 Drawing Sheets

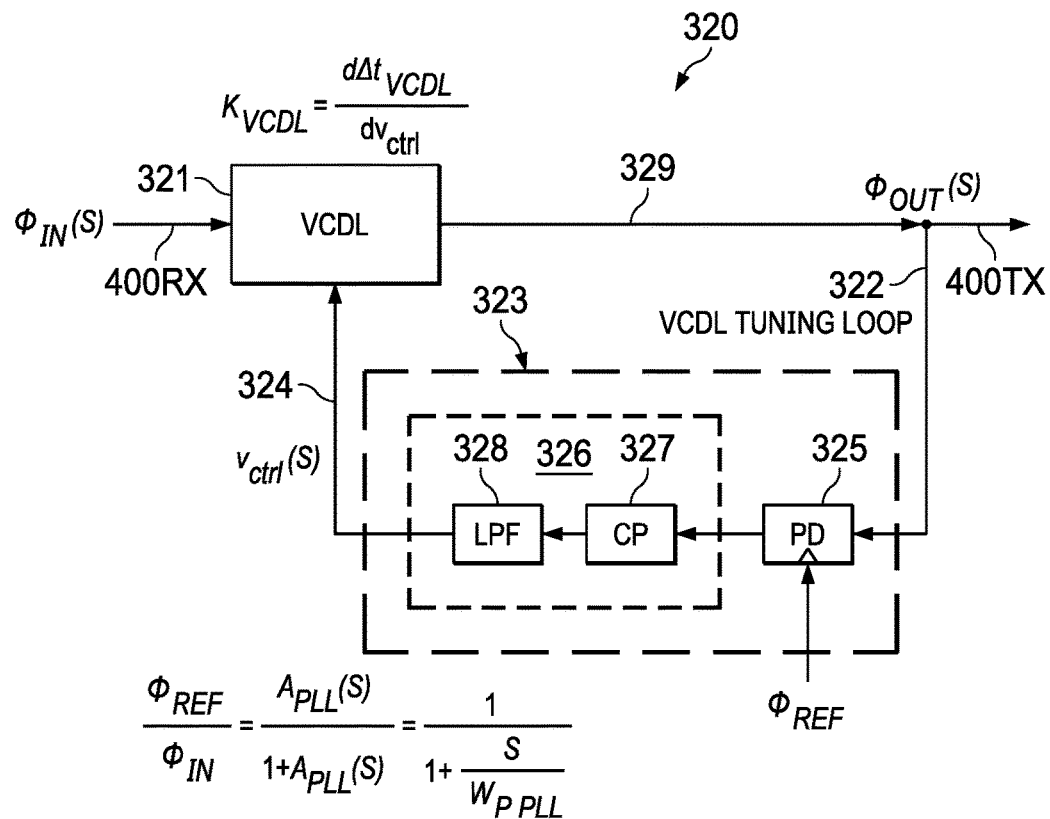
FIG. 3
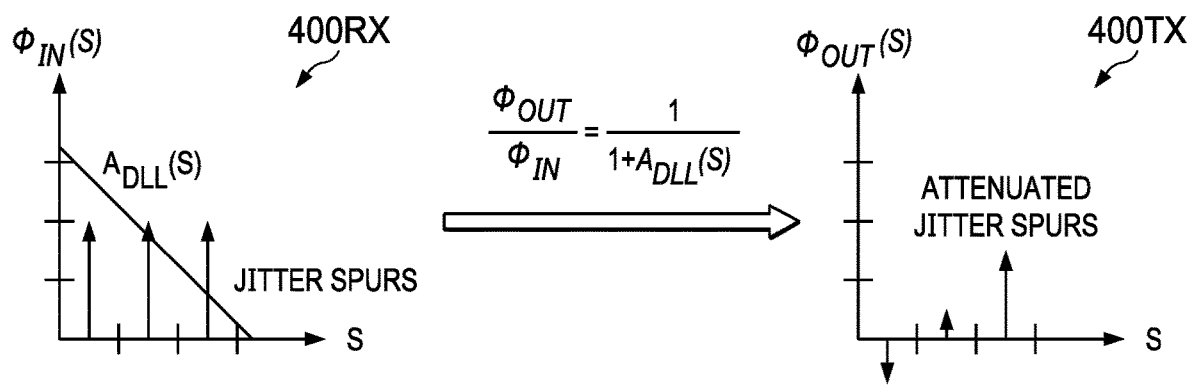
FIG. 4A
FIG. 4B

SIGNAL CONDITIONING IN A SERIAL DATA LINK

CROSS REFERENCE TO RELATED APPLICATION(S)

This divisional application claims priority to U.S. patent application Ser. No. 16/359,026, filed Mar. 20, 2019, which application is incorporated herein by reference in its entirety.

BACKGROUND

Serial data communications links use signal and link conditioning to compensate for channel loss and distortion. Such serial data communications links are sometimes referred to as serdes (serializer/deserializer) links.

For example, linear equalizers (CTLE) can be used to correct for ISI (intersymbol interference). Link training/conditioning can be used to adapt equalization coefficients.

Linear equalizers are transparent to phase noise jitter (random, non-ISI, low frequency jitter). CDR (clock and data recovery) loops reject input phase noise jitter, but are inherently non-linear. Link training requires that signal conditioning devices provide linear transmission of link training (FIR) coefficients, or be protocol aware and digitally transmit the link training coefficients.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for signal conditioning for use in serial data communications, including a delay-locked tuning loop to provide time domain delay modulation to track a reference signal (clock), generating conditioned data signals independent of voltage domain frequency response.

According to aspects of the Disclosure, a methodology for signal conditioning for use in a serial data communications link, can include: receiving serial input data signals; and signal conditioning the input data signals using a delay-locked tuning loop to provide time domain delay modulation of the input data signals to track a reference signal (clock), generating conditioned data signals independent of voltage domain frequency response.

In other aspects of the Disclosure, a signal conditioner for use in a serial data communication link can include an input data interface for coupling into the serial communications link to receive serial input data signals, and transmit circuitry to transmit conditioned data signals over the serial communications link. The signal conditioner can include signal conditioning circuitry coupled in a datapath between the input data interface and the transmit circuitry, the signal conditioning circuitry including a tunable delay element responsive to a tuning signal to provide time domain delay modulation of the input data signals to generate the conditioned data signals, and phase comparator circuitry to generate the delay tuning signal based on a detected phase error between feedback conditioned data signals, and a reference signal. The tunable delay element and the phase comparator circuitry can be configured to form a delay-locked tuning loop to phase lock the conditioned data signals to the reference signal, independent of voltage domain frequency response.

In other aspects of the Disclosure, a jitter attenuator/cleaner for use in a serial data communications link, can include an input data interface for coupling to a communications link to receive serial input data signals, and transmit circuitry to transmit output data signals with jitter attenuation. Signal conditioning circuitry, coupled in a datapath between the input data interface and the transmit circuitry, can include a tunable delay element responsive to a tuning signal to provide time domain delay modulation of the input data signals to generate the output data signals, and phase comparator circuitry to generate the delay tuning signal based on a detected phase error between feedback output data signals, and a reference signal. The tunable delay element and the phase comparator circuitry forming a delay-locked tuning loop to phase lock the output data signals to the reference signal, providing jitter attenuation independent of voltage domain frequency response.

Other aspects and features of the invention claimed in this Patent Document will be apparent to those skilled in the art from the following Disclosure.

BRIEF DESCRIPTION OF THE DRAWINGS

FIG. 3 is an abstracted diagram of a signal conditioner 320, such as the jitter attenuator 200 of FIG. 2, implemented with the example VCDL (tunable delay element) 321 in a VCDL delay-locked tuning loop 322 including a feedback phase comparator 323, to provide a DLL (signal conditioned) output represented by $\phi_{OUT}$ locked to a (low jitter) reference represented by $\phi_{REF}$.

FIGS. 4A-4B provide example plots illustrating phase noise jitter attenuation (frequency domain jitter spur attenuation) between input data 400RX and output data 400TX after signal conditioning.

DETAILED DESCRIPTION

This Description and the Drawings constitute a Disclosure for signal conditioning (such as for phase noise jitter attenuation), based on a tunable delay element in a delay-locked tuning loop, providing time domain delay modulation to track a reference signal (clock) for signal conditioning independent of voltage domain frequency response, including describing design examples (example implementations), and illustrating various technical features and advantages.

A signal conditioner configured for phase noise jitter attenuation according to the Disclosure can be used in the datapath of a serial data communications link (serial data link), such as a signal repeater, for phase noise jitter attenuation. The signal conditioner preserves datapath linearity, without requiring CDR (retiming).

This Disclosure uses the following nomenclature: (a) signal conditioning means conditioning an input signal independent of voltage domain frequency response, as distinguished from phase domain frequency response, and unlike, for example, a linear equalizer; (b) an example of signal conditioning is phase noise jitter attenuation, where phase noise jitter means jitter that is nonequalizable (non-ISI); (c) signal conditioning is based on a tunable delay element, providing time domain delay modulation to track a reference signal (clock) for signal conditioning independent of voltage domain frequency response.

In brief overview, a signal conditioner for use in a serial data communications link. The signal conditioner including a tunable delay element responsive to a tuning signal to provide time domain delay modulation of the input data signals to generate the conditioned data signals, and phase comparator circuitry to generate the delay tuning signal based on a detected phase error between feedback conditioned data signals, and a reference signal. The tunable delay element and the phase comparator circuitry forming a delay-locked tuning loop to phase lock the conditioned data signals to the reference signal, independent of voltage domain frequency response. An example signal conditioner is a jitter attenuator/cleaner, where the bandwidth of the reference signal is lower than the bandwidth of the delay-locked tuning loop, to provide a low-jitter reference signal.

Figure 1:
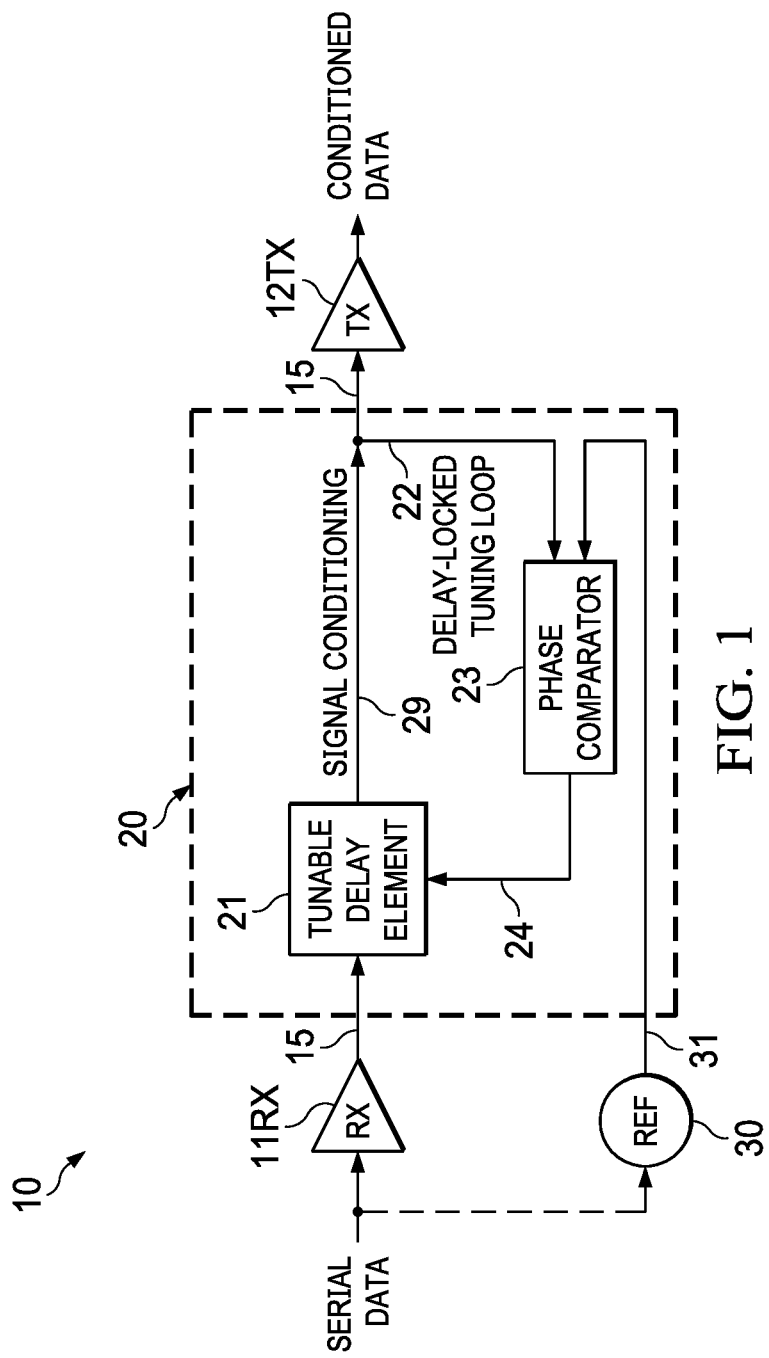
FIG. 1 illustrates an example signal conditioner architecture 20 based on a tunable delay element 21 in a delay-locked tuning loop (DLL) 22, including a feedback phase comparator 23, to provide a signal conditioned (DLL) output 29 with time domain delay modulation to track a reference signal (clock) 31, providing signal conditioning independent of voltage domain frequency responses, according to the Disclosure.

FIG. 1 illustrates a signal conditioner architecture according to the Disclosure, used in an example device 10, such as a signal repeater, included in a serial data (serdes) link. The device 10 is illustrated with an RX interface 11RX and a TX interface 12TX, with a datapath 15 between RX and TX interfaces.

An example signal conditioner 20 is included in the datapath 15, receiving serial input data through the RX interface 11RX. Signal conditioner 20 is designed according to the Disclosure to condition the serial input data independent of voltage domain frequency response. For example, a signal conditioner 20 can be designed for jitter attenuation, providing time domain delay modulation tracking a reference signal for phase noise jitter attenuation independent of voltage domain frequency response.

Signal conditioner 20 includes a tunable delay element 21, with a delay-locked tuning loop 22, outputting signal conditioned data for transmission through the TX interface 12TX over the serial data link. The delay locked tuning loop (DLL) 22 includes a feedback phase comparator 23 to provide a delay-locking tuning signal 27 to the tunable delay element 21. The DLL tuning loop 22 delay-locks the signal conditioned output data 29 to a reference signal (clock) 31 from a reference source 30, modulating the time domain delay to track reference signal phase, providing signal conditioning independent of voltage domain frequency response.

For an example signal conditioner 20 providing jitter attenuation/cleaning, the reference signal (clock) 31 input to the delay tuning loop (phase comparator 23) is preferably a low-jitter reference. For example, if reference source 30 is a PLL generating a reference clock, the PLL bandwidth can be relatively lower than the bandwidth of tunable delay element and tuning loop, with relative bandwidths determined by design specification for jitter attenuation (signal conditioning).

The reference source 30 can be external to the device 10, or integrated into the signal conditioner 20, and can be implemented as a reference generator to generate a reference clock derived or recovered from the input serial data (dashed input line), or as a reference receiver to receive as a transmitted synchronous reference clock.

Signal conditioning according to the Disclosure, based on a tunable delay element with a tuning loop delay-locked to a reference signal (clock), enables the linear transmission of a random data stream, conditioned independent of voltage domain frequency response, such as to provide attenuation for phase noise jitter (dividing/attenuating the phase jitter noise by the loop gain).

Figure 2:
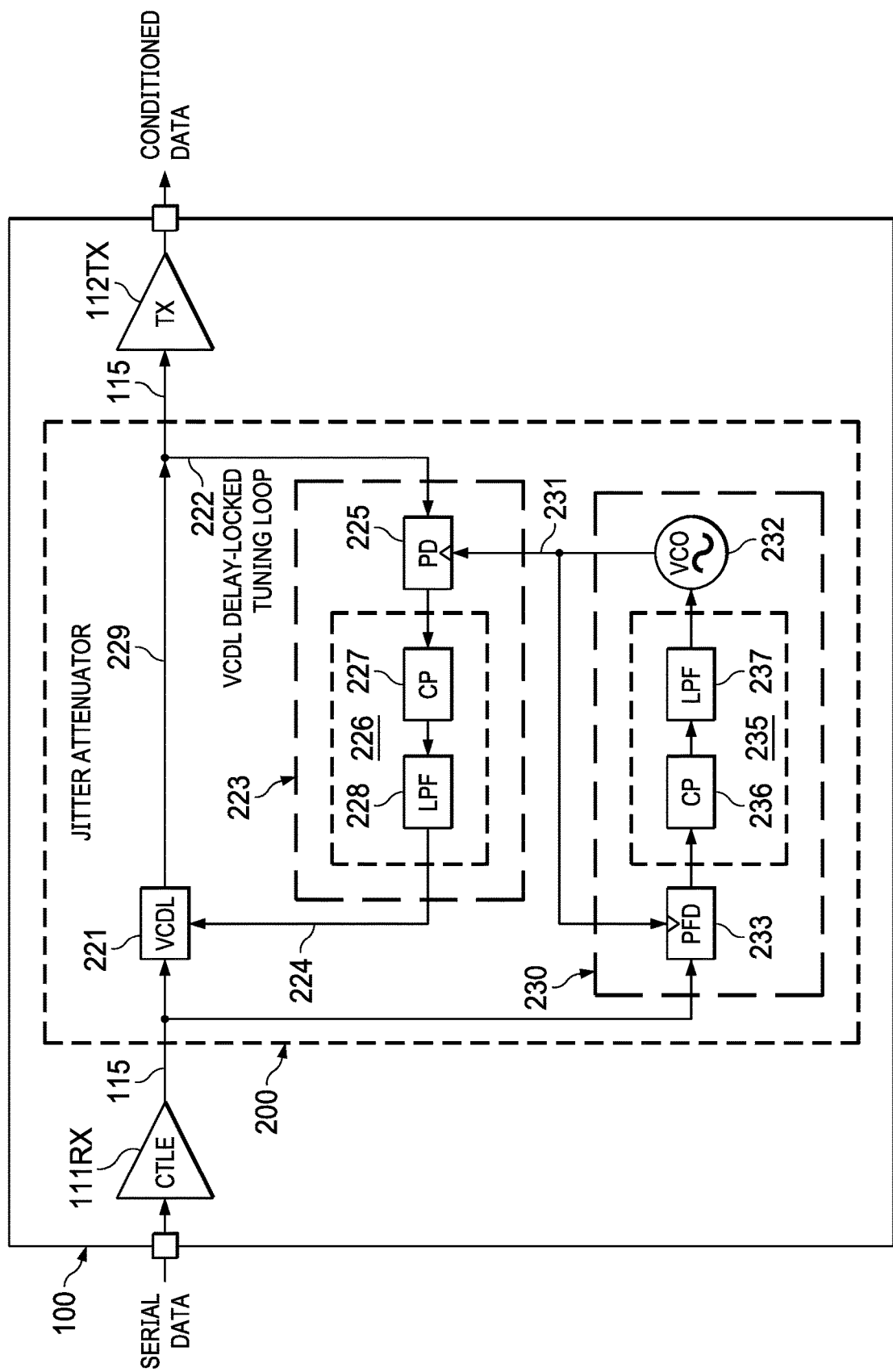
FIG. 2 illustrates an example repeater 100, including a signal conditioner 200 to provide phase jitter attenuation, according to the Disclosure, including a VCDL (tunable delay element) 222 in a VCDL delay-locked tuning loop (DLL), including a feedback phase comparator 223 generating a VCDL delay-locking tuning signal 224, the VCDL generating a DLL (signal conditioned) output 229 locked to a low-jitter reference clock 231 generated by a PLL 230 (integrated), which is locked to the serial input data signal.

FIG. 2 illustrates an example repeater device 100, including a signal conditioner 200, implemented as an example jitter attenuator/cleaner, according to the Disclosure. The example repeater includes a CTLE (continuous time linear equalizer) at the RX end 111RX of the datapath 115.

Jitter attenuator/cleaner 200 is included in the datapath 115, between the RX interface 111RX and the TX interface 112TX, providing jitter attenuation (signal conditioning) according to the Disclosure. Jitter attenuator/cleaner 200 provides phase jitter attenuation independent of voltage domain frequency response, based on time domain delay modulation of the input serial data stream to track a reference signal (clock).

The example jitter attenuator/cleaner 200 is configured with a VCDL (voltage controlled delay line) 221 as the tunable delay element. An example VCDL delay-locked tuning loop 222 includes a feedback phase comparator 223 to generate a VCDL tuning signal 224. The example phase comparator is implemented with a PD (phase detector) 225 and loop filter 226. The example loop filter 226 is implemented with a charge pump 227 and low pass filter (integrator) 228.

The example jitter attenuator 200 includes an integrated PLL 230 to generate a reference clock 231, with a VCO 232 (such as a full rate VCO), generating a clean, low-jitter reference clock. The phase comparator 224 in the VCDL tuning loop 222 includes a PD 233 and loop filter 235 to provide a VCO tuning voltage to VCO 232.

The example PLL 230 is locked to the input serial data. PD 233 compares phase for the serial input data (recovered clock), and the feedback VCO/reference clock, generating the VCDL (phase error) tuning signal. Alternately, PLL 230 can be locked to a transmitted synchronous clock.

The example PLL 230 is implemented with a relatively lower bandwidth than the VCDL (delay locked) tuning loop 222, with relative bandwidths determined by design specification for jitter attenuation. Any phase difference between the VCO/reference clock 231 and the input data, will be detected and filtered in the loop filter 235 to provide the low-jitter VCO/reference clock 231. Any phase difference between the VCO/reference clock 231 and the input serial data that is above the PLL bandwidth but within the VCDL loop bandwidth will be rejected by the VCDL loop gain, attenuating jitter in the signal conditioned output data 229.

In summary, PLL 230 locks the VCO/reference clock 231 to the input data (recovered clock), with PD 233 detecting a phase difference between the recovered clock and the feedback VCO/reference clock, attenuating jitter within the PLL bandwidth to generate a low-jitter VCO/reference clock 231. The VCDL tunable delay element 221 and VCDL delay locked tuning loop 222 lock the output VCDL jitter attenuated (signal conditioned) data 229 to the low-jitter PLL reference clock 231, with PD 225 detecting phase error between the output data 229 and the PLL VCO/reference clock 231, modulating the time domain delay to track VCO/reference clock phase, providing signal conditioning independent of voltage domain frequency response. Phase noise jitter is divided (in the frequency domain) by the VCDL loop gain (see, the loop equations described in connection with FIGS. 3 and 4A-4B).

FIG. 3 is an abstracted diagram of a signal conditioner 320, such as a jitter attenuator/cleaner, used in describing the loop equations (including the example phase noise jitter attenuation). As in the example of FIG. 2, signal conditioner 320 includes a VCDL 321 as the tunable delay element, and a VCDL tuning loop 322, with a feedback phase comparator 323 including PD 325 and loop filter 326 (CP 328 and LPF 329) to generate the VCDL tuning signal 324.

FIGS. 4A-4B provide example plots illustrating phase noise jitter attenuation (frequency domain jitter spur attenuation) between input data 400RX and output data 400TX after signal conditioning (jitter attenuation/cleaning).

A clean, low-jitter reference clock $\phi_{REF}$ can be provided by a relatively lower bandwidth PLL (phase aligned with the input data (as in the example signal conditioner of FIG. 2), or an externally generated synchronous reference). The VCDL time domain delay $\Delta_{VCDL}$ is modulated to track reference clock phase. Within the VCDL loop bandwidth, any difference between the input data phase and the reference phase $\phi_{REF}$ will be divided by the loop gain. For the loop gain equations, the VCDL loop filter (326) LPF is assumed to be a simple integrator.

The following VCDL loop equations describe the operation of the VCDL/VCDL loop, including phase noise jitter attenuation according to the Disclosure:

$$\phi_{OUT} = \phi_{IN} - (\phi_{OUT} - \phi_{REF})A_{DLL}(s) \rightarrow$$

$$\text{where } A_{DLL}(s) = \frac{K_{PD}K_{CP}K_{VCDL}\omega_{data}}{s}$$

$$\phi_{OUT} = \phi_{IN} - \phi_{OUT}A_{DLL}(s) + \phi_{REF}A_{DLL}(s) + \overbrace{\phi_{REF} - \phi_{REF}}^{0}$$

$$\phi_{OUT} - \phi_{REF} = \frac{\phi_{IN} - \phi_{REF}}{1 + A_{DLL}(s)} \xrightarrow{\phi_{REF}=0} \frac{\phi_{OUT}}{\phi_{IN}} = \frac{1}{1 + A_{DLL}(s)}$$

$$\frac{\phi_{REF}}{\phi_{IN}} = \frac{A_{PLL}(s)}{1 + A_{PLL}(s)} = \frac{1}{1 + \frac{s}{\omega_{P\text{-}PLL}}}$$

The phase reference $\phi_{REF}$ reference is a clean, low jitter reference input to the VCDL loop, so that any jitter spurs in the input serial data will be filtered by the VCDL loop (FIG. 4B). That is, the VCDL loop compares frequency domain jitter in the input serial data stream to a clean reference source, and modulates the VCDL delay to generate jitter attenuated (signal conditioned) output data.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A method of signal conditioning for use in a system including a serial data communications link, the method comprising
   receiving serial input data signals; and
   signal conditioning the input data signals using a delay-locked tuning loop to provide time domain delay modulation of the input data signals to track a reference signal, generating conditioned data signals independent of voltage domain frequency response.

2. The method of claim 1, wherein:
   the signal conditioning includes attenuating phase noise jitter; and
   a bandwidth of reference signal is less than a bandwidth of the delay-locked tuning loop.

3. The method of claim 1, wherein the delay-locked tuning loop comprises:
   a tunable delay element to generate the conditioned data signals in response to a delay tuning signal; and
   phase comparator circuitry to generate the delay tuning signal based on a detected phase error between feedback conditioned data signals, and the reference signal;
   the delay-locked tuning loop to lock the conditioned data signals to the reference signal.

4. The circuit of claim 3, wherein the reference signal is a reference clock signal generated by a PLL (phase locked loop), including:
   a VCO (voltage controlled oscillator) to generate the reference clock signal for input to the phase comparator circuitry, and
   a phase detector to generate a reference phase error signal corresponding to a phase difference between the reference clock signal, and the input data signals.

* * * * *